(12) United States Patent
Tsuji et al.

(10) Patent No.: US 9,105,873 B2
(45) Date of Patent: Aug. 11, 2015

(54) ORGANIC ELECTROLUMINESCENT ELEMENT

(75) Inventors: Hiroya Tsuji, Kyoto (JP); Satoshi Ohara, Osaka (JP); Nobuhiro Ide, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/006,418

(22) PCT Filed: Mar. 9, 2012

(86) PCT No.: PCT/JP2012/056139
§ 371 (c)(1),
(2), (4) Date: Sep. 20, 2013

(87) PCT Pub. No.: WO2012/128081
PCT Pub. Date: Sep. 27, 2012

(65) Prior Publication Data
US 2014/0008629 A1    Jan. 9, 2014

(30) Foreign Application Priority Data

Mar. 24, 2011  (JP) ................................. 2011-066564
Mar. 24, 2011  (JP) ................................. 2011-066565

(51) Int. Cl.
*H01L 51/00*    (2006.01)
*H01L 51/52*    (2006.01)
(Continued)

(52) U.S. Cl.
CPC ........ *H01L 51/5262* (2013.01); *H01L 27/3209* (2013.01); *H01L 51/5016* (2013.01); *H01L 51/5044* (2013.01); *H01L 51/0085* (2013.01); *H01L 51/5268* (2013.01)

(58) Field of Classification Search
CPC ............ H01L 51/5012; H01L 51/5016; H01L 51/5036; H01L 51/504; H01L 27/3206; H01L 27/3209; H01L 27/3211; H01L 27/3212; H01L 51/5044; H01L 51/5262; H01L 51/0085; H01L 51/5268
USPC ........................................................ 257/40
See application file for complete search history.

(56) References Cited

U.S. PATENT DOCUMENTS 6,817,735 B2    11/2004    Shimizu et al.
7,008,078 B2     3/2006    Shimizu et al.
(Continued)

FOREIGN PATENT DOCUMENTS

CN    101752512       6/2010
JP    2003-045206     2/2003
(Continued)

OTHER PUBLICATIONS

Office Action from Japan Patent Office (JPO) in Japanese Patent Application No. 2012-273811, dated Apr. 30, 2014.
(Continued)

*Primary Examiner* — Victor A Mandala
*Assistant Examiner* — Quovaunda V Jefferson
(74) *Attorney, Agent, or Firm* — Greenblum & Bernstein, P.L.C.

(57) ABSTRACT

An organic electroluminescent element in accordance with the present invention includes: a transparent electrode; a blue light-emitting layer containing a blue light-emitting material having a maximum emission wavelength 460 nm or less; a first green light-emitting layer containing a first green light-emitting material having a maximum emission wavelength in the spectrum between 460 nm and 610 nm; a red light-emitting layer containing a red light-emitting material having a maximum emission wavelength of 610 nm or more; a second green light-emitting layer containing a second green light-emitting material having a maximum emission wavelength in the spectrum between 460 nm and 610 nm; and a reflecting electrode. The maximum emission wavelength of the first green light-emitting material is located on a short wavelength side of the spectrum. The maximum emission wavelength of the second green light-emitting material is located on a long wavelength side of the spectrum.

13 Claims, 7 Drawing Sheets

(51) Int. Cl.
*H01L 27/32* (2006.01)
*H01L 51/50* (2006.01)

(56) References Cited

U.S. PATENT DOCUMENTS

| | | | |
|---|---|---|---|
| 7,009,338 B2 | 3/2006 | D'Andrade et al. | |
| 7,285,907 B2 | 10/2007 | D'Andrade et al. | |
| 7,701,131 B2 | 4/2010 | Gerhard et al. | |
| 7,919,783 B2 | 4/2011 | Ushikubo et al. | |
| 8,120,020 B2 | 2/2012 | Kho et al. | |
| 8,436,346 B2 | 5/2013 | Ushikubo et al. | |
| 8,518,558 B2 | 8/2013 | Hiyama et al. | |
| 2002/0105267 A1 | 8/2002 | Mochizuki et al. | |
| 2002/0197511 A1 | 12/2002 | D'Andrade et al. | |
| 2003/0063462 A1 | 4/2003 | Shimizu et al. | |
| 2004/0245921 A1* | 12/2004 | Lu et al. | 313/504 |
| 2005/0002191 A1 | 1/2005 | Shimizu et al. | |
| 2005/0035353 A1* | 2/2005 | Adachi et al. | 257/72 |
| 2005/0282036 A1 | 12/2005 | D'Andrade et al. | |
| 2006/0006797 A1* | 1/2006 | Ito et al. | 313/506 |
| 2006/0175958 A1 | 8/2006 | Gerhard et al. | |
| 2007/0223219 A1* | 9/2007 | Medendorp et al. | 362/231 |
| 2008/0130278 A1 | 6/2008 | Ushikubo et al. | |
| 2009/0058278 A1 | 3/2009 | Ushikubo et al. | |
| 2010/0044689 A1 | 2/2010 | Nishimura et al. | |
| 2010/0045172 A1 | 2/2010 | Hiyama et al. | |
| 2010/0133522 A1* | 6/2010 | Pieh et al. | 257/40 |
| 2010/0133573 A1 | 6/2010 | Nowatari et al. | |
| 2010/0163854 A1 | 7/2010 | Kho et al. | |
| 2010/0207110 A1 | 8/2010 | Nishimura et al. | |
| 2011/0042695 A1 | 2/2011 | Oyamada | |
| 2011/0084601 A1 | 4/2011 | Nakayama et al. | |
| 2011/0175076 A1 | 7/2011 | Ushikubo et al. | |
| 2011/0260156 A1 | 10/2011 | Nowatari et al. | |
| 2012/0037896 A1 | 2/2012 | Kaiser et al. | |
| 2012/0211728 A1 | 8/2012 | Ushikubo et al. | |
| 2012/0235166 A1 | 9/2012 | Nowatari et al. | |
| 2012/0248424 A1 | 10/2012 | Sasaki | |
| 2013/0228766 A1 | 9/2013 | Nowatari et al. | |
| 2014/0070198 A1 | 3/2014 | Nowatari et al. | |

FOREIGN PATENT DOCUMENTS

| | | |
|---|---|---|
| JP | 2003-077649 | 3/2003 |
| JP | 2003-173877 | 6/2003 |
| JP | 2004-522276 | 7/2004 |
| JP | 2006-505092 | 2/2006 |
| JP | 2006-156358 | 6/2006 |
| JP | 2006-287154 | 10/2006 |
| JP | 2006-528421 | 12/2006 |
| JP | 2007-189002 | 7/2007 |
| JP | 2008-110968 | 5/2008 |
| JP | 2008-159577 | 7/2008 |
| JP | 2009-076450 | 4/2009 |
| JP | 2009-093981 | 4/2009 |
| JP | 2009-224274 | 10/2009 |
| JP | 2010-157722 | 7/2010 |
| JP | 2011-070963 | 4/2011 |
| JP | 2012-204094 | 10/2012 |
| TW | 200908777 | 2/2009 |
| TW | 200930786 | 7/2009 |
| TW | 201107448 | 3/2011 |
| WO | 2002/091814 | 11/2002 |
| WO | 03/052842 | 6/2003 |
| WO | 2005/011013 | 2/2005 |
| WO | 2008/120611 | 10/2008 |
| WO | 2009/008357 | 1/2009 |
| WO | 2009/125519 | 10/2009 |
| WO | 2010/001830 | 1/2010 |
| WO | 2012/053216 | 4/2012 |

OTHER PUBLICATIONS

U.S. Patent Appl. No. 13/981,445 to Kazuyuki Yamae, filed Jul. 24, 2013.
U.S. Appl. No. 14/000,531 to Takeo Shirai et al., filed Aug. 20, 2013.
International Search Report (ISR) and Written Opinion in International Application No. PCT/JP2012/056139, dated Jun. 19, 2012.
Translation of Search Report from Taiwan Intellectual property Office (TIPO) in Taiwanese Patent Application No. 101108199, dated Sep. 3, 2014.
China Office action, dated May 20, 2015 along with an English translation thereof.

* cited by examiner

Maximum emission wavelength of
blue emission spectrum (nm)

Maximum emission wavelength of
red emission spectrum (nm)

ORGANIC ELECTROLUMINESCENT ELEMENT

TECHNICAL FIELD

The present invention relates to an organic electroluminescent element.

BACKGROUND ART

Organic electroluminescent elements have attracted attention as a next-generation illumination light source because they enable planar light-emission and enable light emission of any color tone depending on the selection of light-emitting substances, and have been vigorously developed with the aim of practical use. In particular, research and development has been actively conducted especially with regard to technologies for improving color rendering properties, which is regarded as one of problems with inorganic LED lighting, and methods for improving color rendering properties by various design and technological developments of devices have been proposed. However, problems still remain in order to realize sufficient improvement in color rendering properties in comparison with conventional main lighting, that is, fluorescent lamps.

In JP 2009-224274A (Patent Literature 1), a method is proposed for improving color rendering properties by stacking a blue-region light-emitting layer having the maximum emission wavelength in a wavelength region between 450 nm and 470 nm, a yellow-region light-emitting layer having a maximum emission wavelength in the wavelength region between 550 nm and 570 nm and a red-region light-emitting layer having the maximum emission wavelength in a wavelength region between 600 nm and 620 nm. High color rendering properties in which an average color rendering index (Ra) is 80 or more, can be realized by thus stacking three light-emitting layers whose emission wavelength regions have been appropriately selected, but Ra of a general fluorescent lamp is from 80 to 90, and problems still remain as a method for realizing sufficiently high color rendering properties in comparison with conventional light sources. Furthermore, a method for improving a special color rendering index R9 for red, which is a problem with inorganic LED lighting and is important to general lighting, is not referred to.

Furthermore, in JP 2007-189002A (Patent Literature 2), a method is proposed for realizing high color rendering properties by using two kinds of blue light-emitting materials having different maximum emission wavelengths, with an emission peak of the blue light-emitting material on a short wavelength side of the spectrum being between 430 nm and 465 nm and an emission peak of a blue light-emitting material on a long wavelength side of the spectrum being between 465 nm and 485 nm, and by using a fluorescent light-emitting material as the blue light-emitting material on the short wavelength side of the spectrum and a phosphorescent light-emitting material as the blue light-emitting material on the long wavelength side of the spectrum. However, there is a problem with the life property of phosphorescent light-emitting materials having an emission peak in a range of 465 nm to 485 nm in comparison with fluorescent light-emitting materials having an emission peak in the same wavelength region, and a material having a high triplet energy level needs to be used as a peripheral material in order to allow such a blue light-emitting material on the short wavelength side of the spectrum to efficiently emit light, thus limiting the device structure. Furthermore, color rendering indices which are important indicators as a method for evaluating the color rendering properties of a light source for lighting applications are not referred to and a method for improving color rendering properties is not clearly defined.

Furthermore, in JP 2006-287154A (Patent Literature 3), a method is proposed for realizing high color rendering properties by having maximum emission wavelengths in the respective regions of 440 nm to 480 nm, 510 nm to 540 nm and 600 nm to 640 nm and setting the minimum emission intensity between the maximum emission wavelengths to be not less than 50% of the maximum emission intensity in the adjacent wavelength region. However, in reality, there are cases where Ra is low even if the minimum emission intensity between the maximum emission wavelengths is not less than 50% of the maximum emission intensity in the adjacent wavelength region and, conversely, it is possible to improve Ra to 90 or more even if a minimum emission intensity between the maximum emission wavelengths is not more than 50% of a maximum emission intensity in the adjacent wavelength region, and thus problems remain as a method for improving color rendering properties. Furthermore, color rendering indices which are important indicators as a method for evaluating color rendering properties of a light source for lighting applications are not referred to and it is also difficult to say that a method for improving color rendering properties is clearly defined in this respect.

Furthermore, in WO2008/120611 A1 (Patent Literature 4), a method is proposed for realizing high color rendering properties by using a light-emitting layer constituted by not more than three layers and using at least four kinds of light-emitting materials having respectively different maximum emission wavelengths as light-emitting materials contained in the light-emitting layer. By using four kinds of light-emitting materials having different maximum emission wavelengths, it is possible to improve Ra to more than 70, but, as described above, Ra of a general fluorescent lamp is from 80 to 90, and thus problems remain as a method for sufficiently improving color rendering properties in comparison with conventional light sources.

CITATION LIST

Patent Literature

Patent Literature 1: JP 2009-224274A
Patent Literature 2: JP 2007-189002A
Patent Literature 3: JP 2006-287154A
Patent Literature 4: WO2008/120611 A1

SUMMARY OF INVENTION

Technical Problem

The present invention was made in view of the problems described above, and it is an object thereof to provide a white organic electroluminescent element having a high color rendering property and high performance, while being highly efficient and long-life, which can improve a color rendering property that is important to an illumination light source, and in which particularly an average color rendering index Ra and a special color rendering index R9 for red are high.

Solution to Problem

An organic electroluminescent element according to the present invention includes: a transparent electrode; a blue light-emitting layer containing a blue light-emitting material having a maximum emission wavelength of 460 nm or less; a first green light-emitting layer containing a first green light-emitting material having a maximum emission wavelength in a spectrum between 460 nm and 610 nm; a red light-emitting layer containing a red light-emitting material having a maximum emission wavelength of 610 nm or more; a second green light-emitting layer containing a second green light-emitting material having a maximum emission wavelength in the spectrum between 460 nm and 610 nm; and a reflecting electrode, wherein the maximum emission wavelength of the first green light-emitting material is located on a short wavelength side of the spectrum; and the maximum emission wavelength of the second green light-emitting material is located on a long wavelength side of the spectrum.

In the organic electroluminescent element, it is preferable that the maximum emission wavelength of the first green light-emitting material is present between 460 nm and 540 nm and the maximum emission wavelength of the second green light-emitting material is present between 540 nm and 610 nm.

An organic electroluminescent element according to the present invention includes: a transparent electrode; a blue light-emitting layer containing a blue light-emitting material having a maximum emission wavelength of 460 nm or less; a first green light-emitting layer containing a first green light-emitting material having a maximum emission wavelength between 460 nm and 540 nm; a second green light-emitting layer containing a second green light-emitting material having a maximum emission wavelength between 540 nm and 610 nm; a red light-emitting layer containing a red light-emitting material having a maximum emission wavelength of 610 nm or more; and a reflecting electrode, wherein a quotient of an emission intensity of the second green light-emitting layer divided by an emission intensity of the red light-emitting layer is 0.66 or less; a quotient of an emission intensity of the blue light-emitting layer divided by an emission intensity of the red light-emitting layer is 0.20 or more; and the organic electroluminescent element is designed to emit light having a color temperature in a range of 2500 K to 3500 K.

In the organic electroluminescent element, it is preferable that a half width of an emission spectrum of at least one of the first green light-emitting material and the second green light-emitting material is 60 nm or more.

In the organic electroluminescent element, it is preferable that a difference between the maximum emission wavelength of the first green light-emitting material and the maximum emission wavelength of the second green light-emitting material is 35 nm or more.

In the organic electroluminescent element, it is preferable that the blue light-emitting material and the first green light-emitting material are fluorescent light-emitting materials and the second green light-emitting material and the red light-emitting material are phosphorescent light-emitting materials.

In the organic electroluminescent element, it is preferable that a fluorescent light-emitting unit including the blue light-emitting layer and the first green light-emitting layer, and a phosphorescent light-emitting unit including the second green light-emitting layer and the red light-emitting layer are stacked such that an intermediate layer is interposed between the fluorescent light-emitting unit and the phosphorescent light-emitting unit.

In the organic electroluminescent element, it is preferable that the fluorescent light-emitting unit is disposed close to the transparent electrode and the phosphorescent light-emitting unit is disposed close to the reflecting electrode.

Advantageous Effects of Invention

According to the present invention, it is possible to provide a white organic electroluminescent element having a high color rendering property and a high performance, while being highly efficient and long-life, which can improve a color rendering property that is important to an illumination light source, and in which particularly an average color rendering index Ra and a special color rendering index R9 for red are high.

DESCRIPTION OF EMBODIMENTS

Hereinafter, embodiments of the present invention will be described.

Figure 1:
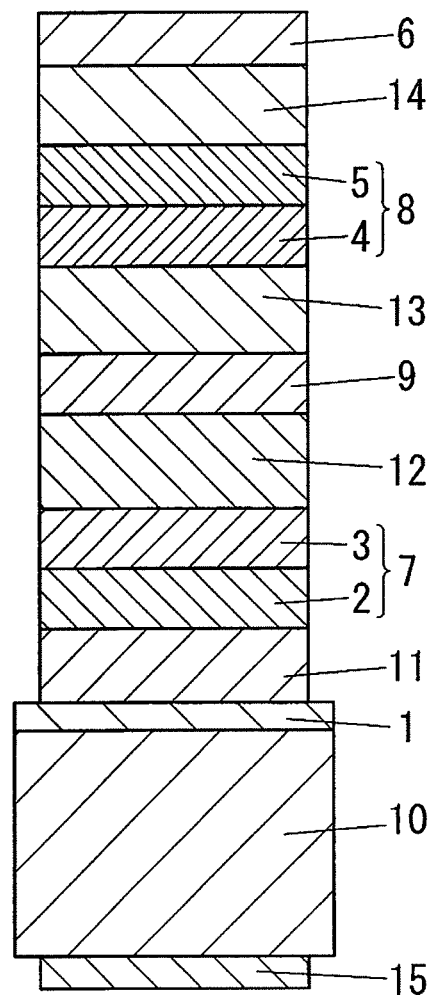
FIG. 1 is a sectional view showing an overview of a layer structure of an organic electroluminescent element.

An example of the structure of an organic electroluminescent element according to the present invention is shown in FIG. 1. This organic electroluminescent element is formed by forming a transparent electrode 1 on a surface of a substrate 10, and stacking a first hole transporting layer 11, a blue light-emitting layer 2, a first green light-emitting layer 3, a first electron transporting layer 12, an intermediate layer 9, a second hole transporting layer 13, a red light-emitting layer 4, a second green light-emitting layer 5, a second electron transporting layer 14 and a reflecting electrode 6 on the transparent electrode 1 in this order. A light extracting layer 15 is further formed on an opposite surface of the substrate 10 to the transparent electrode 1. Hereinafter, embodiments will be described using this structure as an example, but this structure is merely an example, and the present invention is not limited to this structure within the intent of the present invention.

It is preferable that the substrate 10 has optical transparency. The substrate 10 may be colorless and transparent or slightly colored. The substrate 10 may have a frosted glass appearance. Examples of materials for the substrate 10 include transparent glass such as soda-lime glass and alkali-free glass, and plastic such as polyester resin, polyolefin resin, polyamide resin, epoxy resin, and fluorine-based resin. The shape of the substrate 10 may be a film-like shape or a plate-like shape.

The transparent electrode 1 functions as an anode. In the electroluminescent element, the anode serves as an electrode for injecting holes into a light-emitting layer. A metallic oxide such as ITO (indium-tin oxide), $SnO_2$, ZnO and IZO (indium-zinc oxide), or the like is used as material for forming the transparent electrode 1. The transparent electrode 1 may be formed using at least one of these materials by an appropriate method such as a vacuum vapor deposition method, a sputtering method, and application. A preferable thickness of the transparent electrode 1 varies depending on the material constituting the transparent electrode 1, but the thickness may be set to 500 nm or less, and preferably in the range from 10 nm to 200 nm.

Material for forming the first hole transporting layer 11 and the second hole transporting layer 13 (hole transporting material) is appropriately selected from a group of compounds having a hole transporting property, and it is preferable that it is a compound that has a property of donating electrons and is stable when undergoing radical cationization due to electron donation. Examples of the hole transporting materials include: triarylamine-based compounds, amine compounds containing a carbazole group, amine compounds containing fluorene derivatives, and starburst amines (m-MTDATA), representative examples of which include polyaniline, 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4"-tris(N-(3-methylphenyl)N-phenylamino)triphenylamine (MTDATA), 4,4'-N,N'-dicarbazole biphenyl (CBP), Spiro-NPD, spiro-TPD, spiro-TAD, and TNB; and 1-TMATA, 2-TNATA, p-PMTDATA, TFATA or the like as a TDATA-based material, but examples thereof are not limited to these, and any hole transporting material that is generally known is used. The first hole transporting layer 11 and the second hole transporting layer 13 can be formed by an appropriate method such as a vapor deposition method.

It is preferable that material for forming the first electron transporting layer 12 and the second electron transporting layer 14 (electron transporting material) is a compound that has the ability to transport electrons, can accept electrons injected from the reflecting electrode 6, and exhibits excellent electron injection effects on the light-emitting layers, and moreover, prevents the movement of holes to the first electron transporting layer 12 and the second electron transporting layer 14 and is excellent in terms of thin film formability. Examples of the electron transporting materials include Alq3, oxadiazole derivatives, starburst oxadiazole, triazole derivatives, phenylquinoxaline derivatives, and silole derivatives. Specific examples of the electron transporting materials include fluorene, bathophenanthroline, bathocuproine, anthraquinodimethane, diphenoquinone, oxazole, oxadiazole, triazole, imidazole, anthraquinodimethane, 4,4'-N,N'-di-carbazole biphenyl (CBP), etc., and compounds thereof, metal-complex compounds, and nitrogen-containing five-membered ring derivatives. Specifically, examples of metal-complex compounds include tris(8-hydroxyquinolinato)aluminum, tri(2-methyl-8-hydroxyquinolinato)aluminum, tris (8-hydroxyquinolinato)gallium, bis(10-hydroxybenzo[h] quinolinato)beryllium, bis(10-hydroxybenzo[h]quinolinato) zinc, bis(2-methyl-8-quinolinato)(o-cresolate)gallium, bis (2-methyl-8-quinolinato)(1-naphtholate)aluminum, and bis (2-methy-8-quinolinato)-4-phenylphenolato, but are not limited thereto. Preferable examples of nitrogen-containing five-membered ring derivatives include oxazole, thiazole, oxadiazole, thiadiazole, and triazole derivatives, and specific examples thereof include 2,5-bis(1-phenyl)-1,3,4-oxazole, 2,5-bis(1-phenyl)-1,3,4-thiazole, 2,5-bis(1-phenyl)-1,3,4-oxaniazole, 2-(4'-tert-butylphenyl)-5-(4"-biphenyl)1,3,4-oxadiazole, 2,5-bis(1-naphthyl)-1,3,4-oxadiazole, 1,4-bis[2-(5-phenylthiadiazolyl)]benzene, 2,5-bis(1-naphthyl)-1,3,4-triazole, and 3-(4-biphenylyl)-4-phenyl-5-(4-t-butylphenyl)-1,2,4-triazole, but are not limited thereto. Examples of the electron transporting materials include the polymer materials used for a polymer organic electroluminescent element. Examples of these polymer materials include polyparaphenylene and derivatives thereof, and fluorene and derivatives thereof. There is no particular limitation on the thicknesses of the first electron transporting layer 12 and the second electron transporting layer 14, and for example, they are formed to have thicknesses in the range of 10 nm to 300 nm. The first electron transporting layer 12 and the second electron transporting layer 14 can be formed by an appropriate method such as a vapor deposition method.

The reflecting electrode 6 functions as a cathode. In the organic electroluminescent element, the cathode serves as an electrode for injecting electrons into a light-emitting layer. It is preferable that the reflecting electrode 6 is formed of a material having a small work function, such as a metal, an alloy, an electric conductive compound, and a mixture of these. Examples of materials for forming the reflecting electrode 6 include Al, Ag, and MgAg. The reflecting electrode 6 may be formed of an $Al/Al_2O_3$ mixture, and such like. The reflecting electrode 6 may be formed using at least one of these materials by an appropriate method such as a vacuum vapor deposition method and a sputtering method. A preferable thickness of the reflecting electrode 6 varies depending on the material of the reflecting electrode 6, but the thickness may be set to 500 nm or less, and preferably in the range from 20 nm to 200 nm.

The light extracting layer 15 can be formed by stacking a light-scattering film or a microlens film on the opposite surface of the substrate 10 from the transparent electrode 1 to improve a light diffusion property.

Then, in the organic electroluminescent element according to the present invention, as described below, color rendering properties can be improved by combining a plurality of light-emitting materials having appropriate maximum emission wavelengths (emission peak wavelengths), or by using light-emitting materials having maximum emission wavelengths in a specific emission region and controlling the ratio of emission intensities.

Each of the light-emitting layers (the blue light-emitting layer 2, the first green light-emitting layer 3, the red light-emitting layer 4 and the second green light-emitting layer 5) may be formed of an organic material (host material) doped with a light-emitting material (dopant).

Any of an electron transporting material, a hole transporting material, and a material having both of electron transporting property and hole transporting property may be used as the host material. An electron transporting material and a hole transporting material may be used in combination as the host material.

A blue light-emitting material contained in the blue light-emitting layer 2 is not particularly limited as long as it has a maximum emission wavelength of 460 nm or less (lower limit of about 430 nm), and any fluorescent light-emitting material or any phosphorescent light-emitting material can be used. However, since there is a problem with the durability of not only blue phosphorescent light-emitting materials having a maximum emission wavelength of 460 nm or less but also peripheral materials thereof, it is more effective to select a fluorescent light-emitting material as the blue light-emitting material to realize an organic electroluminescent element having high color rendering properties and excellent life property. Even when using the fluorescent light-emitting material which produces light with a relatively short wavelength, high efficiency and long life are realized.

Examples of host materials used for the blue light-emitting layer 2 include TBADN (2-t-butyl-9,10-di(2-naphthyl)anthracene), ADN, and BDAF. It is preferable that the concentration of the blue light-emitting material is in the range from 1% by mass to 30% by mass.

Figure 2:
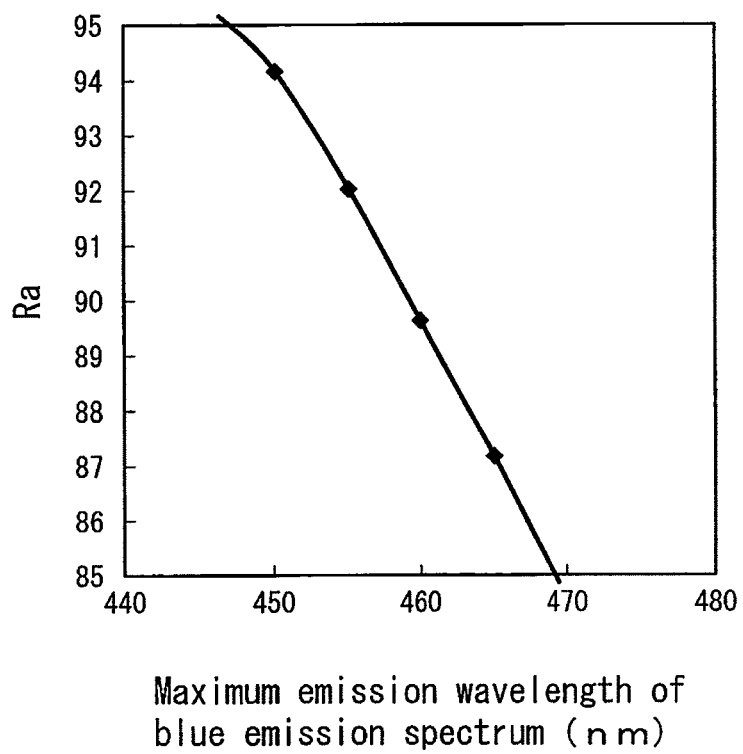
FIG. 2 is a graph showing the relation between the maximum emission wavelength of a blue emission spectrum and an average color rendering index Ra of the organic electroluminescent element.

In a case where the red light emitting material is $Pq_2Ir$ (acac), the green light-emitting material is $Ir(ppy)_3$, and the blue light-emitting material is TBP (1-tert-butyl-perylene), FIG. 2 shows calculation results of an average color rendering index Ra with regard to the emission spectrum of the blue light-emitting material in the range of 445 nm to 470 nm. As is obvious from FIG. 2, it is important to shorten the wavelength of the blue emission spectrum to realize high color rendering properties, and a blue emission with a short wavelength of 460 nm or less is particularly effective to realize high color rendering properties in which the average color rendering index Ra is more than 90 (the average color rendering index Ra of a bulb-shaped fluorescent lamp is 84). With regard to a white light-emitting device with four wavelengths (the organic electroluminescent elements of Examples 1 and 2 described below) in which TPA having a maximum emission wavelength at 530 nm, $Bt_2Ir(acac)$ having a maximum emission wavelength at 566 nm and $Ir(piq)_3$ having a maximum emission wavelength at 629 nm are used and BCzVBi is used as a blue light-emitting material, a similar examination was conducted. The result of this examination shows that color rendering properties improve as the wavelength of the blue emission spectrum shortens, and it is possible to realize high color rendering properties in which the average color rendering index Ra is more than 90 in a region where the maximum emission wavelength is 460 nm or less. Color rendering properties depend on the shape of the spectrum, and the above is an example. If a light-emitting material having a general emission spectrum (a half width of the spectrum of about 40 to 80 nm) is used, the maximum emission wavelength greatly affects color rendering properties. In summary, shortening a maximum emission wavelength of a blue light-emitting material is effective in improving color rendering properties.

Each of a first green light-emitting material contained in the first green light-emitting layer 3 and a second green light-emitting material contained in the second green light-emitting layer 5 has a maximum emission wavelength in a spectrum between 460 nm and 610 nm. However, the maximum emission wavelength of the first green light-emitting material is located on a short wavelength side of the spectrum, and the maximum emission wavelength of the second green light-emitting material is located on a long wavelength side of the spectrum.

The first green light-emitting material contained in the first green light-emitting layer 3 is not particularly limited as long as it satisfies the above-described requirements, and any fluorescent light-emitting material or any phosphorescent light-emitting material can be used. Since there is a problem with the durability of not only green phosphorescent light-emitting materials emitting light with a relatively short wavelength but also peripheral materials thereof, it is more effective to select a fluorescent light-emitting material as the first green light-emitting material to realize an organic electroluminescent element having high color rendering properties and excellent life property, similarly to the blue light-emitting material. Even when using the fluorescent light-emitting material which produces light with a relatively short wavelength, high efficiency and long life are realized. Furthermore, it is preferable that the maximum emission wavelength of the first green light-emitting material is present between 460 nm and 540 nm. With using the first green light-emitting material having the maximum emission wavelength in this region, the emission spectrum of the first green light-emitting material can compensate for absence of a spectrum between the emission spectrum of the blue light-emitting material and the emission spectrum of the second green light-emitting material. Thus, it is possible to further improve color rendering properties.

Examples of host materials used for the first green light-emitting layer 3 include $Alq_3$ (tris-(8-oxoquinoline)aluminium (III)), ADN, and BDAF. It is preferable that the concentration of the first green light-emitting material is in the range from 1% by mass to 20% by mass.

As is the case with the first green-light emitting material, the second green light-emitting material contained in the second green light-emitting layer 5 is not particularly limited as long as it satisfies the above-described requirements, and any fluorescent light-emitting material or any phosphorescent light-emitting material can be used. High efficiency and long life have already been realized with phosphorescent light-emitting materials emitting light in this region which has a relatively long wavelength. Furthermore, since phosphorescent light-emitting materials have a relatively long wavelength, materials with high triplet energy levels, which include few materials having excellent durability, are not particularly required for the peripheral materials, although such materials are required to improve the efficiency of a device that uses a blue light-emitting material or a green light-emitting material that has a short wavelength. Considering this aspect, it is more effective to select a phosphorescent light-emitting material as the second green light-emitting material. Since high efficiency and long life are realized by this phosphorescent light-emitting material which produces light with a relatively long wavelength as described above, it is possible to improve color rendering properties and to realize high efficiency and long life in the organic electroluminescent element. Furthermore, it is preferable that the maximum emission wavelength of the second green light-emitting material is present between 540 nm and 610 nm. With using a second green light-emitting material having a maximum emission wavelength in this region, the emission spectrum of the second green light-emitting material can compensate for absence of a spectrum between the emission spectrum of the first green light-emitting material and the emission spectrum of the red light-emitting material. Thus, it is possible to further improve color rendering properties.

Examples of host materials used for the second green light-emitting layer 5 include CBP (4,4'-N,N'-dicarbazole-biphenyl), CzTT, TCTA, mCP, and CDBP. It is preferable that the concentration of the second green light-emitting material is in the range from 1% by mass to 40% by mass.

There is no particular limitation on the half width of the emission spectrum of the first green light-emitting material and the second green light-emitting material, but it is preferable that the half width of the emission spectrum of at least one of the first green light-emitting material and the second green light-emitting material is 60 nm or more, and it is more preferable that it is 70 nm or more (upper limit of about 120 nm). When a green light-emitting material has an emission spectrum with a large half width of 60 nm or more, the green light emitting material can appropriately compensate for absence of a spectrum in a broad wavelength region between the blue emission spectrum with a short wavelength and the red emission spectrum with a long wavelength, and it is effective in improving color rendering properties. Of course, if the half widths of the spectra of both the first green light-emitting material and the second green light-emitting material are 60 nm or more, it is more effective in improving color rendering properties.

Figure 3A:
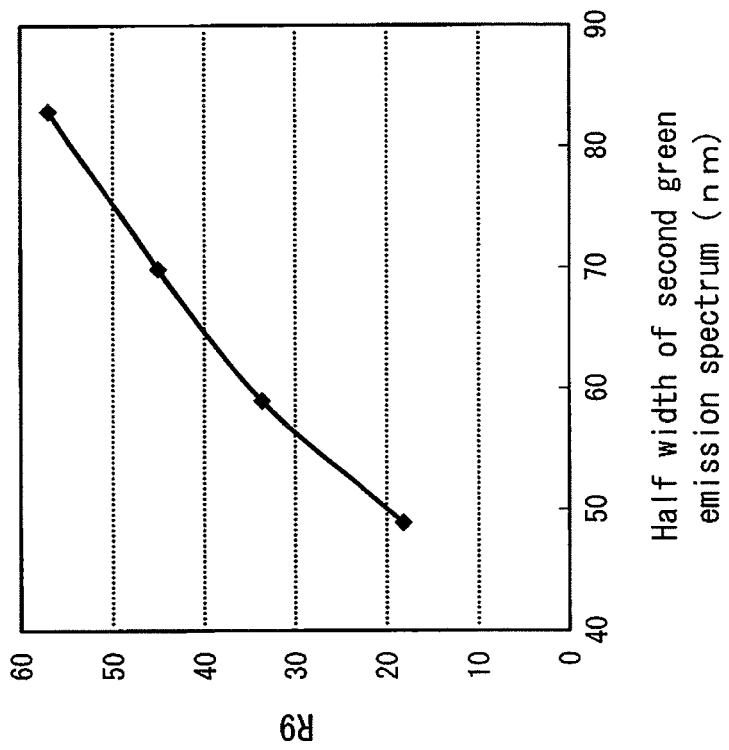
FIG. 3A is a graph showing the relation between the half width of a second green emission spectrum and an average color rendering index Ra of the organic electroluminescent element.
Figure 3B:
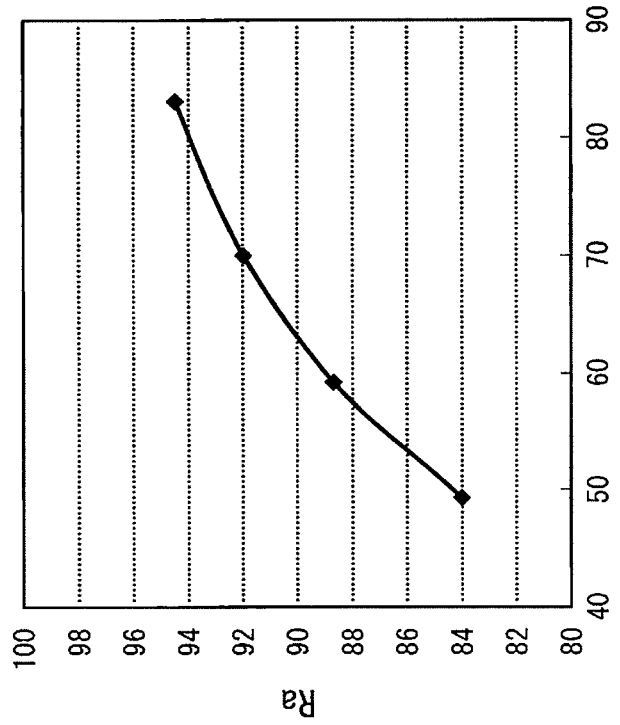
FIG. 3B is a graph showing the relation between the half width of a second green emission spectrum and a special color rendering index R9 (red) of the organic electroluminescent element.

FIG. 3 is a graph showing the relations between the half width of the emission spectrum of the second green light-emitting material (second green emission spectrum) and the average color rendering index Ra as well as the special color rendering index R9 (red), wherein the half width of the second green emission spectrum is varied from 50 nm to 83 nm while a blue light-emitting material, a first green light-emitting material, and a red light-emitting material are not changed. As is obvious from FIG. 3, high color rendering properties can be obtained in both the average color rendering index Ra and the special color rendering index R9 (red) when the half width of the second green emission spectrum is 60 nm or more. Color rendering properties depend on the shape of the spectrum, and the above is an example. The half width of the green emission spectrum greatly affects color rendering properties. In summary increasing in the half width of the green emission spectrum is effective in improving color rendering properties.

There is no particular limitation on the difference between the maximum emission wavelength of the first green light-emitting material and the maximum emission wavelength of the second green light-emitting material, but it is preferable that it is 35 nm or more, and it is more preferable that it is 40 nm or more (upper limit of about 100 nm). Wavelength regions occupied by the respective green emission spectra can be distinct from each other when green light-emitting materials which satisfy a condition that the difference between their maximum emission wavelengths is 35 nm or more are used, and it is possible to further improve color rendering properties.

Figure 4A:
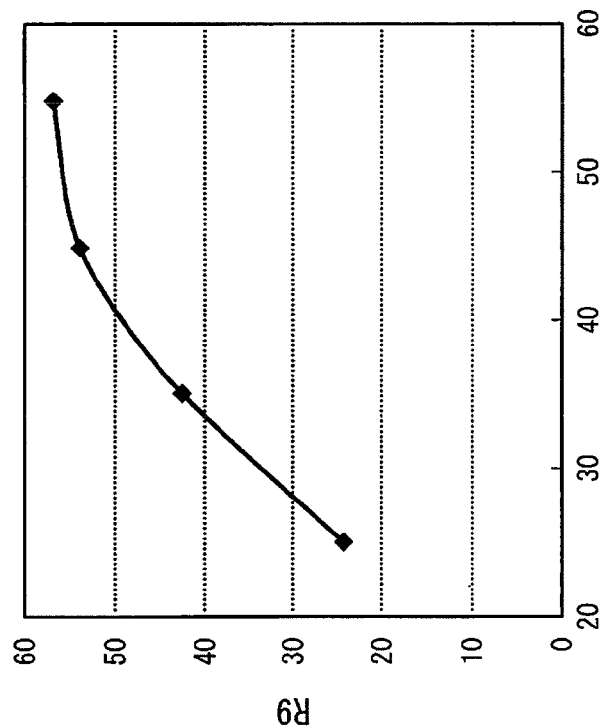
FIG. 4A is a graph showing the relation between the difference of the maximum emission wavelength of a first green light-emitting material from the maximum emission wavelength of a second green light-emitting material and an average color rendering index Ra.
Figure 4B:
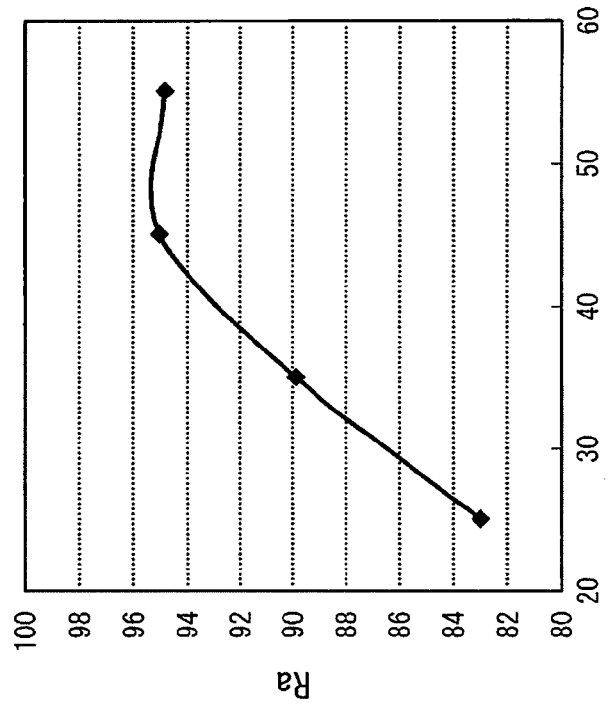
FIG. 4B is a graph showing the relation between the difference of the maximum emission wavelength of a first green light-emitting material from the maximum emission wavelength of a second green light-emitting material and a special color rendering index R9 (red)

FIG. 4 is a graph showing the relations between the difference of the maximum emission wavelength of the first green light-emitting material from the maximum emission wavelength of the second green light-emitting material (the difference between maximum emission wavelengths of the green light-emitting materials) and the average color rendering index Ra as well as the special color rendering index R9 (red). As is obvious from FIG. 4, if the difference between the maximum emission wavelength of the first green light-emitting material and the maximum emission wavelength of the second green light-emitting material is 35 nm or more, high color rendering properties can be obtained in both the average color rendering index Ra and the special color rendering index R9 (red). Color rendering properties depend on the shape of the spectrum, and the above is an example. Color rendering properties are greatly affected by the difference between the maximum emission wavelength of the first green light-emitting material and the maximum emission wavelength of the second green light-emitting material. In summary, increasing in this difference between maximum emission wavelengths is effective in improving color rendering properties.

The red light-emitting material contained in the red light-emitting layer 4 is not particularly limited as long as it has the maximum emission wavelength of 610 nm or more (upper limit of about 640 nm), and any fluorescent light-emitting material or any phosphorescent light-emitting material can be used. For the same reason as the second green light-emitting material, it is more effective to select a phosphorescent light-emitting material as the red light-emitting material to realize an organic electroluminescent element having high color rendering properties, high efficiency, and long life. High efficiency and long life are realized by this phosphorescent light-emitting material that produces light with a relatively long wavelength.

Figure 5:
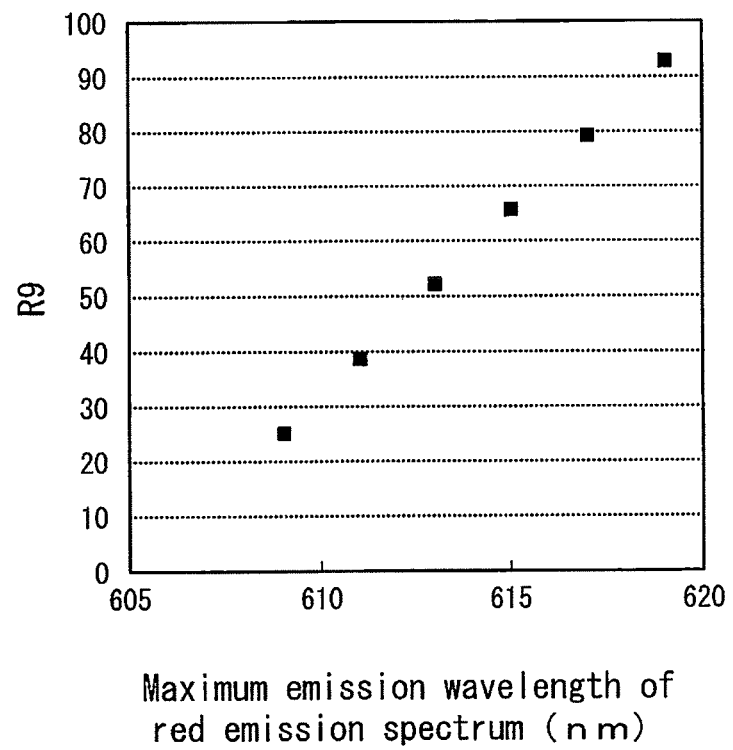
FIG. 5 is a graph showing the relation between the maximum emission wavelength of a red emission spectrum and a special color rendering index R9 (red) of the organic electroluminescent element.

FIG. 5 is a graph showing the relation between the maximum emission wavelength of the red light-emitting material and the special color rendering index R9 (red). Namely, the graph shows calculation results of the special color rendering index R9 (red) obtained when the emission spectrum of the red light-emitting material is shifted in a case where the blue light-emitting material is BCzVBi, the first green light-emitting material is TPA, the second green light-emitting material is $Bt_2Ir(acac)$, and the red light-emitting material is $Ir(piq)_3$. As is obvious from FIG. 5, increasing in the wavelength of the maximum emission wavelength of the red emission spectrum is effective in improving the special color rendering index R9 (red) and, particularly, increasing in the wavelength to 610 nm or more is important to improve color rendering properties in which the special color rendering index R9 (red) is more than 30 (the special color rendering index R9 (red) of a bulb-shaped fluorescent lamp is about 25).

Figure 6A:
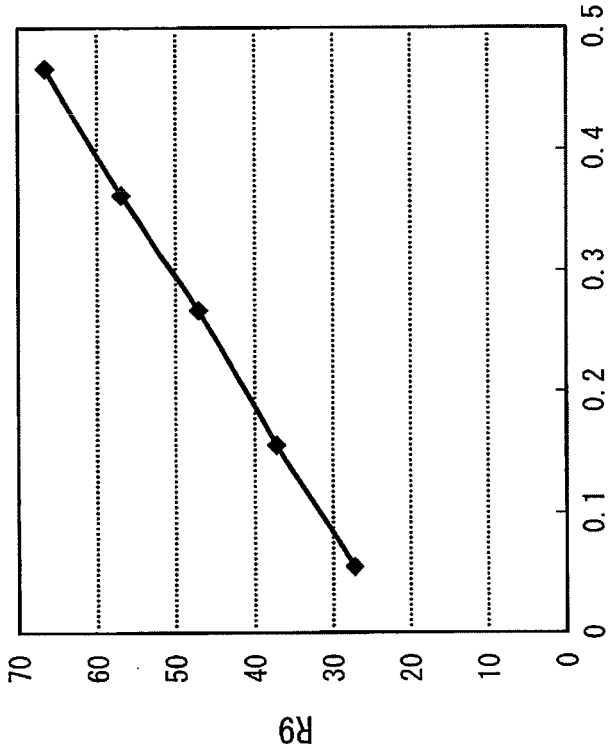
FIG. 6A is a graph showing the relation between a quotient of the emission intensity of a blue light-emitting layer divided by the emission intensity of a red light-emitting layer and an average color rendering index Ra.
Figure 6B:
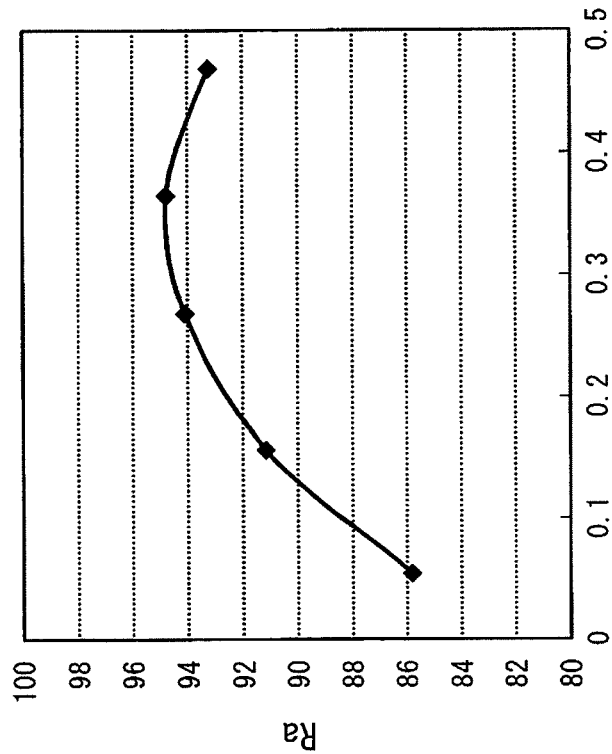
FIG. 6B is a graph showing the relation between a quotient of the emission intensity of a blue light-emitting layer divided by the emission intensity of a red light-emitting layer and a special color rendering index R9 (red)

FIG. 6 shows the relations between the quotient of the emission intensity of the blue light-emitting layer 2 divided by the emission intensity of the red light-emitting layer 4 and the average color rendering index Ra as well as the special color rendering index R9 (red). As is obvious from FIG. 6, increasing in the quotient of the emission intensity of the blue light-emitting layer 2 divided by the emission intensity of the red light-emitting layer 4 is important to improve color rendering properties. Particularly, the quotient of the emission intensity of the blue light-emitting layer 2 divided by the emission intensity of the red light-emitting layer 4 of 0.20 or more is effective in improving color rendering properties in which the average color rendering index Ra is more than 90 (the average color rendering index Ra of a bulb-shaped fluorescent lamp is 84). Note that there is no particular limitation on the upper limit of this quotient, but it is about 0.70.

Figure 7A:
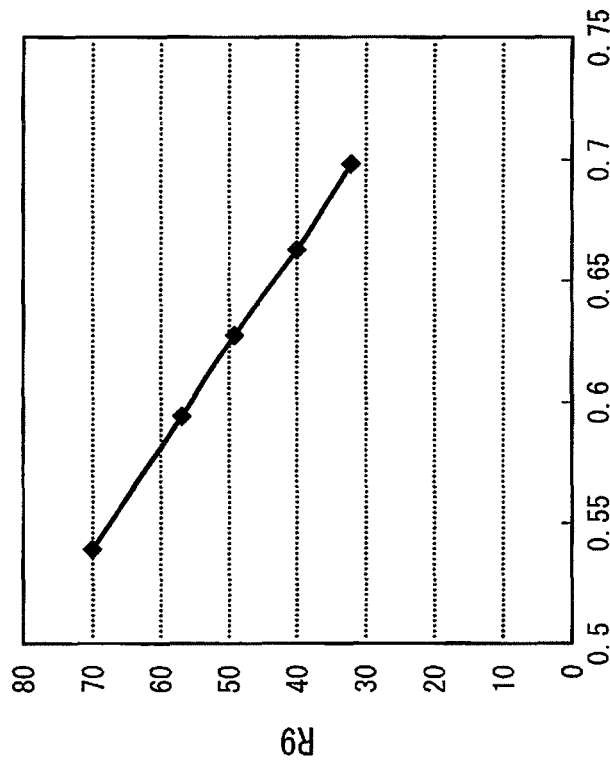
FIG. 7A is a graph showing the relation between a quotient of the emission intensity of a second green light-emitting layer divided by the emission intensity of a red light-emitting layer and an average color rendering index Ra.
Figure 7B:
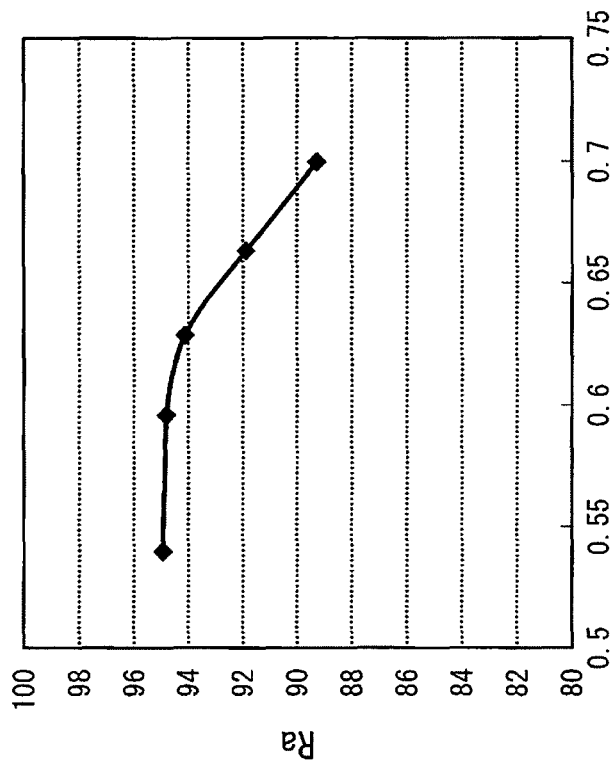
FIG. 7B is a graph showing the relation between a quotient of the emission intensity of a second green light-emitting layer divided by the emission intensity of a red light-emitting layer and a special color rendering index R9 (red).

FIG. 7 shows the relations between the quotient of the emission intensity of the second green light-emitting layer 5 divided by the emission intensity of the red light-emitting layer 4 and the average color rendering index Ra as well as the special color rendering index R9 (red). As is obvious from FIG. 7, reducing the quotient of the emission intensity of the second green light-emitting layer 5 divided by the emission intensity of the red light-emitting layer 4 is important to improve color rendering properties. The quotient of the emission intensity of the second green light-emitting layer 5 divided by the emission intensity of the red light-emitting layer 4 of 0.66 or less is effective in improving color rendering properties in which the average color rendering index Ra is more than 90 and the special color rendering index R9 (red) is more than 30 (the special color rendering index R9 (red) of a bulb-shaped fluorescent lamp is about 25). Note that there is no particular limitation on the lower limit of this quotient, but it is about 0.30. Color rendering properties depend on the shape of the spectrum, and the above is an example. If a light-emitting material having a general emission spectrum (a half width of the spectrum of about 40 to 80 nm) is used, color rendering properties are thus greatly affected by the relation between the quotient of the emission intensity of the blue light-emitting layer 2 divided by the emission intensity of the red light-emitting layer 4 and the quotient of the emission intensity of the second green light-emitting layer 5 divided by the emission intensity of the red light-emitting layer 4. Accordingly, in the present invention, the quotient of the emission intensity of the second green light-emitting layer 5 divided by the emission intensity of the red light-emitting layer 4 is 0.66 or less and the quotient of the emission intensity of the blue light-emitting layer 2 divided by the emission intensity of the red light-emitting layer 4 is 0.20 or more, so that color rendering properties are improved.

Examples of host materials used for the red light-emitting layer 4 include CBP (4,4'-N,N'-dicarbazole-biphenyl), CzTT, TCTA, mCP, and CDBP. It is preferable that the concentration of the red light-emitting material is in the range from 1% by mass to 40% by mass.

Each of the light-emitting layers (the blue light-emitting layer 2, the first green light-emitting layer 3, the red light-emitting layer 4 and the second green light-emitting layer 5) may be formed by appropriate methods including a dry process (e.g., a vacuum vapor deposition and transfer) and a wet process (e.g., spin coating, spray coating, die coating, and gravure printing). Note that the emission intensity of each light-emitting layer can be adjusted, for example, by increasing or reducing the film thickness of each light-emitting layer.

In the organic electroluminescent element according to the present invention, there is no particular limitation, but it is preferable that a fluorescent light-emitting unit 7 and a phosphorescent light-emitting unit 8 are stacked such that an intermediate layer (interlayer) 9 is interposed between them, so that a multiunit structure is formed as shown in FIG. 1. The fluorescent light-emitting unit 7 includes the blue light-emitting layer 2 and the first green light-emitting layer 3 which are stacked, and both the blue light-emitting layer 2 and the first green light-emitting layer 3 contain fluorescent light-emitting materials. The phosphorescent light-emitting unit 8 includes the second green light-emitting layer 5 and the red light-emitting layer 4 which are stacked, and both the second green light-emitting layer 5 and the red light-emitting layer 4 contain phosphorescent light-emitting materials.

Furthermore, the organic electroluminescent element according to the present invention may be designed to emit light having a color temperature in the range of 2500 K to 3500 K. Note that it becomes difficult to simultaneously realize light-emission and high color rendering properties (high Ra and high R9) in a region of white light, which is required for lighting applications, if the range of the color temperature is less than 2500 K or more than 3500 K.

The intermediate layer 9 serves the function of electrically connecting two light-emitting units in series. It is preferable that the intermediate layer 9 has high transparency and is highly thermally and electrically stable. The intermediate layer 9 can be formed of a layer that forms an equipotential surface, a charge generation layer, or the like. Examples of the materials for a layer that forms an equipotential surface or a charge generation layer include: a thin film of metal such as Ag, Au, or Al; metal oxides such as vanadium oxide, molybdenum oxide, rhenium oxide, and tungsten oxide; a transparent conductive film such as ITO, IZO, AZO, GZO, ATO, and $SnO_2$; a so-called laminate of an n-type semiconductor and a p-type semiconductor; a laminate of a metal thin film or transparent conductive film, and either one of or both an n-type semiconductor and a p-type semiconductor; a mixture of an n-type semiconductor and a p-type semiconductor; and a mixture of a metal and either one of or both an n-type semiconductor and a p-type semiconductor. There is no particular limitation on the n-type semiconductor and the p-type semiconductor, and any semiconductors selected as necessary are used. The n-type semiconductor and the p-type semiconductor may be formed of either an inorganic material or an organic material. The n-type semiconductor and the p-type semiconductor may be a mixture of an organic material and a metal; a combination of an organic material and a metal oxide; or a combination of an organic material and an organic acceptor/donor material or inorganic acceptor/donor material. The intermediate layer 9 can be formed of BCP:Li, ITO, $NPD:MoO_3$, Liq:Al, or the like. BCP indicates 2,9-dimethyl-4,7-diphenyl-1,10-phenanthroline. For example, the intermediate layer 9 can have a two-layered configuration obtained by disposing a first layer made of BCP:Li close to the anode, and a second layer made of ITO close to the cathode side. It is preferable that the intermediate layer 9 has a layer structure such as $Alq3/Li_2O/HAT\text{-}CN6$, $Alq3/Li_2O$, or $Alq3/Li_2O/Alq3/HAT\text{-}CN6$.

The material necessary for improving the performance of the fluorescent light-emitting unit 7 and the material necessary for improving the performance of the phosphorescent light-emitting unit 8 have different physical properties such as ionization potential, electron affinity and triplet energy level. However, the intermediate layer 9 is disposed so that the fluorescent light-emitting unit 7 and the phosphorescent light-emitting unit 8 are separated by the intermediate layer 9. Hence, it is possible to select different materials for the respective units. This separation of the fluorescent light-emitting unit 7 and the phosphorescent light-emitting unit 8 is effective in realizing high efficiency and long life. Furthermore, using a multiunit structure in which the fluorescent light-emitting unit 7 having an emission spectrum in the region of a relatively short wavelength and the phosphorescent light-emitting unit 8 having an emission spectrum in the region of a relatively long wavelength can be arranged separately owing the interposed intermediate layer 9 can facilitate optical design. Consequently, it is possible to realize high efficiency, long life, high luminance, a reduced viewing angle dependency of chromaticity and the like as well as improved color rendering properties.

Furthermore, in view of improving efficiency and suppressing the viewing angle dependency of chromaticity, it is preferable that the fluorescent light-emitting unit 7 is disposed close to the transparent electrode 1 and the phosphorescent light-emitting unit 8 is disposed close to the reflecting electrode 6 as shown in FIG. 1. Loss due to interference is less for a light-emitting unit disposed close to the reflecting electrode 6 than for a light-emitting unit disposed close to the transparent electrode 1, and the light extraction efficiency of the light-emitting unit disposed close to the reflecting electrode 6 tends to be higher than the light extraction efficiency of the light-emitting unit disposed close to the transparent electrode 1. Therefore, it is possible to improve performance, color rendering properties and efficiency by disposing the phosphorescent light-emitting unit 8 with a high internal quantum efficiency close to the reflecting electrode 6 where the light extraction efficiency is relatively high.

As described above, if a light-emitting layer is formed by using a blue light-emitting material having a short wavelength and a maximum emission wavelength of 460 nm or less, a red light-emitting material having a long wavelength and a maximum emission wavelength of 610 nm or more, and two kinds of a green light-emitting material having different maximum emission wavelengths in the spectrum between 460 nm and 610 nm, in the organic electroluminescent element according to the present invention, it is possible to improve color rendering properties because two kinds of the green light-emitting material occupy the broad wavelength region between the blue light-emitting material with a short wavelength and the red light-emitting material with a long wavelength.

Furthermore, in the organic electroluminescent element according to the present invention, it is possible to obtain white light-emission having a color temperature in the range of 2500 K to 3500 K and to further improve color rendering properties by appropriately combining light-emitting materials having four different maximum emission wavelengths so that the quotient of the emission intensity of the second green light-emitting layer 5 divided by the emission intensity of the red light-emitting layer 4 is 0.66 or less and the quotient of the emission intensity of the blue light-emitting layer 2 divided by the emission intensity of the red light-emitting layer 4 is 0.20 or more.

EXAMPLES

Hereinafter, the present invention will be specifically described by way of examples.

Example 1

An organic electroluminescent element as shown in FIG. 1 was manufactured. Specifically, a transparent electrode 1 was formed by depositing ITO with a thickness of 130 nm on a substrate 10 (a glass substrate). A first hole transporting layer 11, a blue light-emitting layer 2 (containing BCzVBi, which is a fluorescent light-emitting material, as a blue light-emitting material), a first green light-emitting layer 3 (containing TPA, which is a fluorescent light-emitting material, as a first green light-emitting material) and a first electron transporting layer 4 were further formed by a vapor deposition method with a thickness between 5 nm and 60 nm and stacked on the transparent electrode 1 in this order. Next, an intermediate layer 9 having a layer structure of Alq3/Li$_2$O/Alq3/HAT-CN6 was stacked with a layer thickness of 15 nm. Then, a second hole transporting layer 13, a red light-emitting layer 4 (containing Ir(piq)$_3$, which is a phosphorescent light-emitting material, as a red light-emitting material), a second green light-emitting layer 5 (containing Bt$_2$Ir(acac), which is a phosphorescent light-emitting material, as a second green light-emitting material) and a second electron transporting layer 14 were formed with a maximum film thickness of each layer of 50 nm and stacked in this order. Subsequently, a reflecting electrode 6 made of an Al film was sequentially formed. Note that a light-scattering film was stacked on the opposite surface of the substrate 10 to the transparent electrode 1 to form the light extracting layer 15.

The average color rendering index Ra and the special color rendering index R9 (red) of a white spectrum of the organic electroluminescent element obtained as described above are shown in Table 1. Table 1 obviously shows that the high average color rendering index Ra and the high special color rendering index R9 (red) can be simultaneously obtained in the organic electroluminescent element of Example 1.

Comparative Example 1-1

An organic electroluminescent element was manufactured in the same manner as in Example 1, except that DPAVBi was used as the blue light-emitting material.

Since DPAVBi having a maximum emission wavelength of more than 460 nm was used as the blue light-emitting material, it is confirmed that the average color rendering index Ra is low in the organic electroluminescent element obtained as described above.

Comparative Example 1-2

An organic electroluminescent element was manufactured in the same manner as in Example 1, except that Pq$_2$Ir(acac) was used as the red light-emitting material.

Since Pq$_2$Ir(acac) having a maximum emission wavelength of less than 610 nm was used as the red light-emitting material, it is confirmed that the special color rendering index R9 (red) is low in the organic electroluminescent element obtained as described above.

Comparative Example 1-3

An organic electroluminescent element was manufactured in the same manner as in Example 1, except that Ir(ppy)$_3$ was used as the first green light-emitting material and no second green light-emitting material was used.

It is confirmed that both the average color rendering index Ra and the special color rendering index R9 (red) are low in the organic electroluminescent element obtained as described above.

TABLE 1

|  | Blue light-emitting material (Maximum emission wavelength) | First green light-emitting material (Maximum emission wavelength) | Second green light-emitting material (Maximum emission wavelength) | Red light-emitting material (Maximum emission wavelength) | Ra | R9 |
| --- | --- | --- | --- | --- | --- | --- |
| Example 1 | BCzVBi (450 nm) | TPA (530 nm) | Bt$_2$Ir(acac) (566 nm) | Ir(piq)$_3$ (629 nm) | 93 | 88 |
| Comparative Example 1-1 | DPAVBi (475 nm) | TPA (530 nm) | Bt$_2$Ir(acac) (566 nm) | Ir(piq)$_3$ (629 nm) | 73 | 80 |
| Comparative Example 1-2 | BCzVBi (450 nm) | TPA (530 nm) | Bt$_2$Ir(acac) (566 nm) | Pq$_2$Ir(acac) (608 nm) | 82 | 13 |
| Comparative Example 1-3 | BCzVBi (450 nm) | Ir(ppy)$_3$ (517 nm) | — | Ir(piq)$_3$ (629 nm) | 70 | 50 |

Example 2

An organic electroluminescent element having a multiunit structure as shown in FIG. 1 was manufactured. Specifically, a transparent electrode 1 was formed into a film by depositing ITO with a thickness of 130 nm on a substrate 10 (a glass substrate). A first hole transporting layer 11, a blue light-emitting layer 2 (containing BCzVBi, which is a fluorescent light-emitting material, as a blue light-emitting material), a first green light-emitting layer 3 (containing TPA, which is a fluorescent light-emitting material, as a first green light-emitting material) and a first electron transporting layer 4 were further formed by a vapor deposition method with a thickness between 5 nm and 60 nm and stacked on the transparent electrode 1 in this order. The blue light-emitting layer 2 and the first green light-emitting layer 3 constitute a fluorescent light-emitting unit 7. Next, an intermediate layer 9 having a layer structure of $Alq3/Li_2O/Alq3/HAT-CN6$ was stacked with a layer thickness of 15 nm. Then, a second hole transporting layer 13, a red light-emitting layer 4 (containing $Ir(piq)_3$, which is a phosphorescent light-emitting material, as a red light-emitting material), a second green light-emitting layer 5 (containing $Bt_2Ir(acac)$, which is a phosphorescent light-emitting material, as a second green light-emitting material) and a second electron transporting layer 14 were formed with a maximum film thickness of each layer of 50 nm and stacked in this order. The red light-emitting layer 4 and the second green light-emitting layer 5 constitute a phosphorescent light-emitting unit 8. Subsequently, a reflecting electrode 6 made of an Al film was sequentially formed. Note that the light-scattering film was stacked on the opposite surface of the substrate 10 to the transparent electrode 1 to form the light extracting layer 15.

To adjust the emission intensities of the respective emission colors to desired values, the blue light-emitting layer 2 was formed to have a film thickness of 20 nm, and the first green light-emitting layer 3 was formed to have a film thickness of 20 nm, and the second green light-emitting layer 5 was formed to have a film thickness of 10 nm, and the red light-emitting layer 4 was formed to have a film thickness of 30 nm.

The quotient of the emission intensity of a blue light-emitting layer 2 divided by the emission intensity of a red light-emitting layer 4, the quotient of the emission intensity of a second green light-emitting layer 5 divided by the emission intensity of a red light-emitting layer 4, the average color rendering index Ra, and the special color rendering index R9 (red) of the organic electroluminescent element obtained as described above are shown in Table 2. Table 2 clearly shows that both the average color rendering index Ra and the special color rendering index R9 (red) are very high in the organic electroluminescent element of Example 2.

Comparative Example 2-1

An organic electroluminescent element was manufactured in the same manner as in Example 2, except that the film thickness of the blue light-emitting layer 2 was set to 10 nm and the film thickness of the first green light-emitting layer 3 was set to 30 nm.

Since the quotient of the emission intensity of the blue light-emitting layer 2 divided by the emission intensity of the red light-emitting layer 4 is less than 0.20, it is confirmed that both the average color rendering index Ra and the special color rendering index R9 (red) are low and, especially, the special color rendering index R9 (red) is low in the organic electroluminescent element obtained as described above.

Comparative Example 2-2

An organic electroluminescent element was manufactured in the same manner as in Example 2, except that the film thickness of the second green light-emitting layer 5 was set to 15 nm and the film thickness of the red light-emitting layer 4 was set to 25 nm.

Since the quotient of the emission intensity of the second green light-emitting layer 5 divided by the emission intensity of the red light-emitting layer 4 is more than 0.66, it is confirmed that both the average color rendering index Ra and the special color rendering index R9 (red) are low and, especially, the special color rendering index R9 (red) is low in the organic electroluminescent element obtained as described above.

TABLE 2

| | Quotient of emission intensity of blue light-emitting layer divided by emission intensity of red light-emitting layer | Quotient of emission intensity of second green light-emitting layer divided by emission intensity of red light-emitting layer | Ra | R9 |
|---|---|---|---|---|
| Example 2 | 0.36 | 0.60 | 93 | 67 |
| Comparative Example 2-1 | 0.10 | 0.60 | 82 | 23 |
| Comparative Example 2-2 | 0.36 | 0.72 | 78 | 13 |

REFERENCE SIGNS LIST

1 Transparent electrode
2 Blue light-emitting layer
3 First green light-emitting layer
4 Red light-emitting layer
5 Second green light-emitting layer
6 Reflecting electrode
7 Fluorescent light-emitting unit
8 Phosphorescent light-emitting unit
9 Intermediate layer

The invention claimed is:
1. An organic electroluminescent element comprising:
a transparent electrode;
a fluorescent light-emitter including a blue light-emitting layer and a first green light-emitting layer, the blue light-emitting layer containing a blue light-emitting material having a maximum emission wavelength 460 nm or less, the first green light-emitting layer containing a first green light-emitting material having a maximum emission wavelength in a spectrum between 460 nm and 610 nm;
a phosphorescent light-emitter including green light-emitting layer and a red light-emitting layer, the red light-emitting layer containing a red light-emitting material having a maximum emission wavelength of 610 nm or more, the second green light-emitting layer containing a second green light-emitting material having a maximum emission wavelength in the spectrum between 460 nm and 610 nm; and
a reflecting electrode,
wherein:
the maximum emission wavelength of the first green light-emitting material is located on a short wavelength side of the spectrum;
the maximum emission wavelength of the second green light-emitting material is located on a long wavelength side of the spectrum;
the blue light-emitting material and the first green light-emitting material are fluorescent light-emitting materials;
the second green light-emitting material and the red light-emitting material are phosphorescent light emitting materials; and the fluorescent light-emitter and the phosphorescent light-emitter are stacked such that an intermediate layer is interposed between the fluorescent light-emitter and the phosphorescent light-emitter.

2. The organic electroluminescent element according to claim 1, wherein:
the maximum emission wavelength of the first green light-emitting material is present between 460 nm and 540 nm; and
the maximum emission wavelength of the second green light-emitting material is present between 540 nm and 610 nm.

3. The organic electroluminescent element according to claim 1, wherein
a half width of an emission spectrum of at least one of the first green light-emitting material and the second green light-emitting material is 60 nm or more.

4. The organic electroluminescent element according to claim 1, wherein
a difference between the maximum emission wavelength of the first green light-emitting material and the maximum emission wavelength of the second green light-emitting material is 35 nm or more.

5. The organic electroluminescent element according to claim 1, wherein:
the fluorescent light-emitter is disposed close to the transparent electrode; and
the phosphorescent light-emitter is disposed close to the reflecting electrode.

6. An organic electroluminescent element comprising:
a transparent electrode;
a fluorescent light-emitter including a blue light-emitting layer and a first green light-emitting layer, the blue light-emitting layer containing a blue light-emitting material having a maximum emission wavelength 460 nm or less, the first green light-emitting layer containing a first green light-emitting material having a maximum emission wavelength between 460 nm and 540 nm;
a phosphorescent light-emitter including a second green light-emitting layer and a red light-emitting layer, the second green light-emitting layer containing a second green light-emitting material having a maximum emission wavelength between 540 nm and 610 nm, the red light-emitting layer containing a red light-emitting material having a maximum emission wavelength of 610 nm or more; and
a reflecting electrode,
wherein:
a quotient of an emission intensity of the second green light-emitting layer divided by an emission intensity of the red light-emitting layer is 0.66 or less;
a quotient of an emission intensity of the blue light-emitting layer divided by an emission intensity of the red light-emitting layer is 0.20 or more;
the organic electroluminescent element is designed to emit light having a color temperature in a range of 2500 K to 3500 K;
the blue light-emitting material and the first green light-emitting material are fluorescent light-emitting materials;
the second green light-emitting material and the red light-emitting material are phosphorescent light-emitting materials;
the fluorescent light-emitter and the phosphorescent light-emitter are stacked such that an intermediate layer is interposed between the fluorescent light-emitter and the phosphorescent light-emitter.

7. The organic electroluminescent element according to claim 6, wherein
a half width of an emission spectrum of at least one of the first green light-emitting material and the second green light-emitting material is 60 nm or more.

8. The organic electroluminescent element according to claim 6, wherein
a difference between the maximum emission wavelength of the first green light-emitting material and the maximum emission wavelength of the second green light-emitting material is 35 nm or more.

9. The organic electroluminescent element according to claim 6, wherein:
the fluorescent light-emitter is disposed close to the transparent electrode; and
the phosphorescent light-emitter is disposed close to the reflecting electrode.

10. An organic electroluminescent element comprising:
a transparent electrode;
a blue light-emitting layer containing a blue light-emitting material having a maximum emission wavelength 460 nm or less;
a first green light-emitting layer containing a first green light-emitting material having a maximum emission wavelength in a spectrum between 460 nm and 610 nm;
a red light-emitting layer containing a red light-emitting material having a maximum emission wavelength of 610 nm or more;
a second green light-emitting layer containing a second green light-emitting material having a maximum emission wavelength in the spectrum between 460 nm and 610 nm; and
a reflecting electrode,
wherein:
the maximum emission wavelength of the first green light-emitting material is located on a short wavelength side of the spectrum;
the maximum emission wavelength of the second green light-emitting material is located on a long wavelength side of the spectrum; and
the organic electroluminescent element has a special color rendering index R9 which is more than 30.

11. The organic electroluminescent element according to claim 10, wherein:
the blue light-emitting material and the first green light-emitting material are fluorescent light-emitting materials; and
the second green light-emitting material and the red light-emitting material are phosphorescent light-emitting materials.

12. The organic electroluminescent element according to claim 11, wherein
a fluorescent light-emitter including the blue light-emitting layer and the first green light-emitting layer, and a phosphorescent light-emitter including the second green light-emitting layer and the red light-emitting layer are stacked such that an intermediate layer is interposed between the fluorescent light-emitter and the phosphorescent light-emitter.

13. The organic electroluminescent element according to claim 12, wherein:
the fluorescent light-emitter is disposed closer to the transparent electrode than the phosphorescent light-emitter; and
the phosphorescent light-emitter is disposed closer to the reflecting electrode than the fluorescent light-emitter.

* * * * *